(12) United States Patent
Kim

(10) Patent No.: US 8,384,110 B2
(45) Date of Patent: Feb. 26, 2013

(54) LIGHT EMITTING DEVICE

(75) Inventor: Jae Wook Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/252,461

(22) Filed: Oct. 4, 2011

(65) Prior Publication Data

US 2012/0086033 A1 Apr. 12, 2012

(30) Foreign Application Priority Data

Oct. 6, 2010 (KR) .................. 10-2010-0097281

(51) Int. Cl.
*H01L 33/00* (2010.01)
*H01L 27/15* (2006.01)

(52) U.S. Cl. ............................. 257/98; 257/79; 257/101

(58) Field of Classification Search ................. None
See application file for complete search history.

(56) References Cited

U.S. PATENT DOCUMENTS

| 2004/0173802 A1* | 9/2004 | Yukimoto ................. 257/79 |
| 2007/0215882 A1* | 9/2007 | Son ......................... 257/79 |
| 2011/0175120 A1* | 7/2011 | Yoon et al. ................. 257/94 |

FOREIGN PATENT DOCUMENTS

KR 10-2010-0054756 * 5/2010

OTHER PUBLICATIONS

Hyun-Min Jung et al., Via-hole-based Vertical GaN Light Emitting Diodes, Applied Physics Letters 91, Published Sep. 11, 2007, pp. 2-4.*

* cited by examiner

*Primary Examiner* — Julio J Maldonado
*Assistant Examiner* — Harpreet Singh
(74) *Attorney, Agent, or Firm* — KED & Associates LLP

(57) ABSTRACT

A lighting emitting device includes a conductive substrate; a first conductive layer formed on the conductive substrate; a second conductive layer formed on the first conductive layer; a second semiconductor layer formed on the second conductive layer; an active layer formed on the second semiconductor layer; a first semiconductor layer being formed on the active layer and including a charge distribution layer; and an insulation layer.

18 Claims, 4 Drawing Sheets ized, omitted or schematically shown for the purpose of convenience and clearness of description. The size of each component may not necessarily mean its actual size.

LIGHT EMITTING DEVICE

CROSS-REFERENCE TO RELATED APPLICATION

The present application claims priority under 35 U.S.C. §119(e) of Korean Patent Application No. 10-2010-0097281 filed on Oct. 6, 2010, which is hereby incorporated by reference in its entirety.

BACKGROUND

1. Field

Embodiments may relate to a light emitting device.

2. Background

A light emitting diode (LED) is a semiconductor element for converting electric energy into light. As compared with existing light sources such as a fluorescent lamp and an incandescent electric lamp and so on, the LED has advantages of low power consumption, a semi-permanent span of life, a rapid response speed, safety and an environment-friendliness. For this reason, many researches are devoted to substitution of the existing light sources with the LED. The LED is now increasingly used as a light source for lighting devices, for example, various lamps used interiorly and exteriorly, a liquid crystal display device, an electric sign and a street lamp and the like.

SUMMARY

One embodiment of the present invention is a light emitting device. The light emitting device includes a conductive substrate; a first conductive layer formed on the conductive substrate; a second conductive layer formed on the first conductive layer; a second semiconductor layer formed on the second conductive layer; an active layer formed on the second semiconductor layer; a first semiconductor layer being formed on the active layer and including a charge distribution layer; and an insulation layer. The first conductive layer includes at least one via which penetrates the second conductive layer, the second semiconductor layer and the active layer and projects into a certain area of the first semiconductor layer, and then is electrically connected to the first semiconductor layer. The insulation layer is formed between the first conductive layer and the second conductive layer and on the side wall of the via. The charge distribution layer has a doping concentration lower than that of the first semiconductor layer.

The charge distribution layer may be formed above the via.

The charge distribution layer may be penetrated by an area of the via, which projects into the first semiconductor layer.

A light emitting device according to another embodiment of the present invention comprises, a conductive substrate; a first conductive layer formed on the conductive substrate; a second conductive layer formed on the first conductive layer; a second semiconductor layer formed on the second conductive layer; an active layer formed on the second semiconductor layer; a first semiconductor layer formed on the active layer; and an insulation layer, wherein the first conductive layer includes at least one via which penetrates the second conductive layer, the second semiconductor layer and the active layer and projects into a certain area of the first semiconductor layer, and then is electrically connected to the first semiconductor layer, wherein the insulation layer is foamed between the first conductive layer and the second conductive layer and on the side wall of the via, wherein the first semiconductor layer includes a charge distribution layer therein, and wherein the charge distribution layer has an electrical conductivity lower than that of the first semiconductor layer.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

First Embodiment

Figure 1:
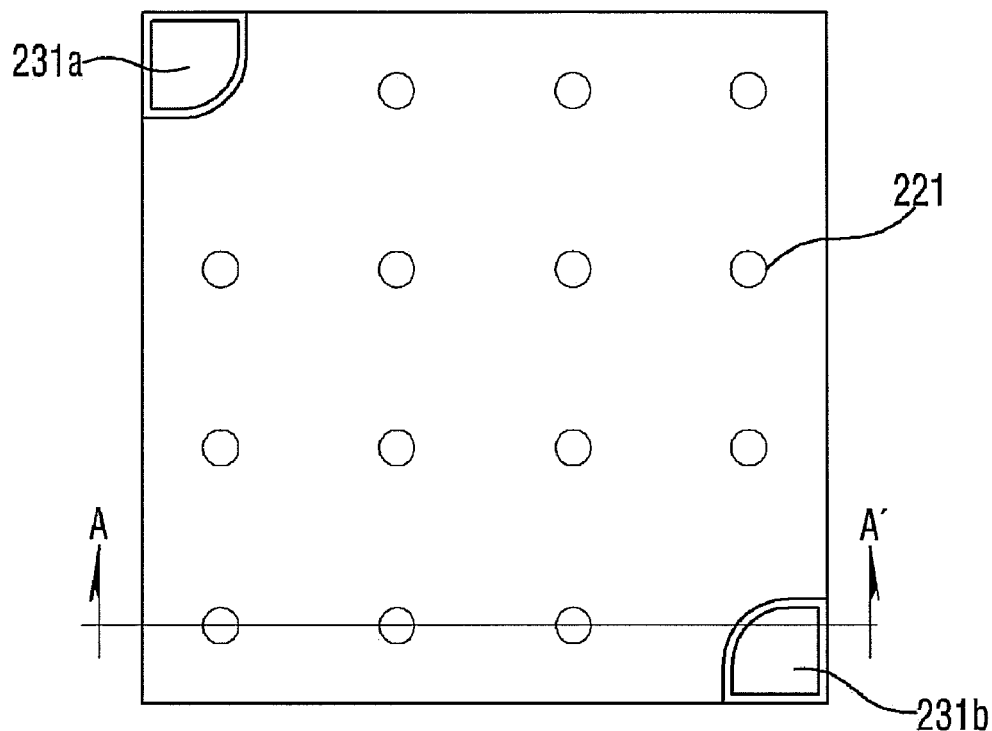
FIG. 1 is a view showing a top surface of a light emitting device according to a first embodiment of the present invention.
Figure 2:
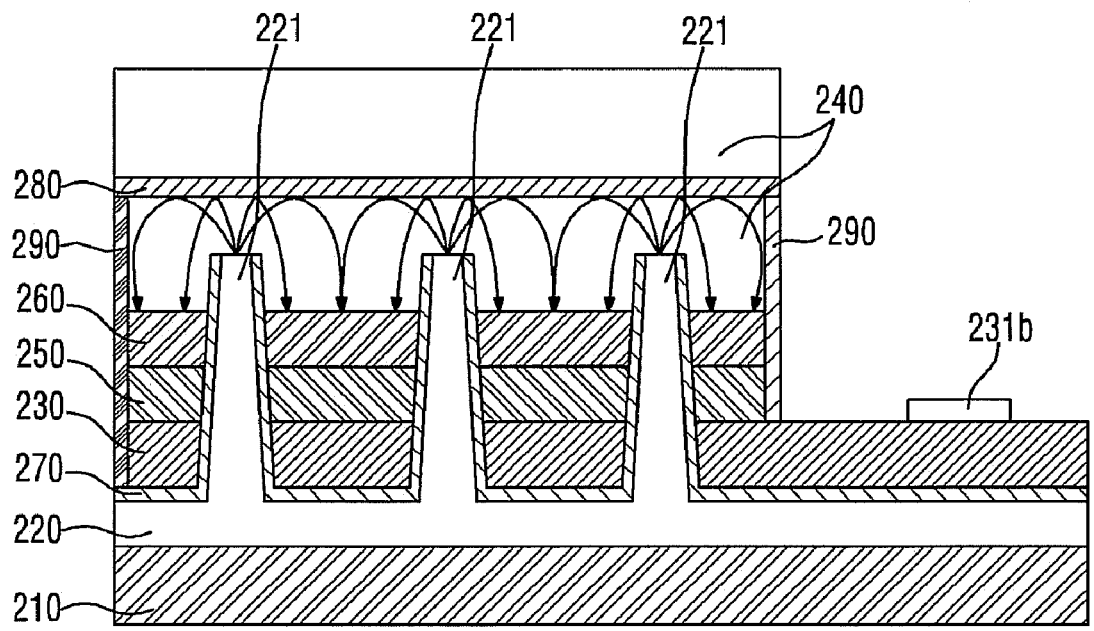
FIG. 2 is a cross sectional view of the light emitting device, taken along line A-A' of FIG. 1.

FIG. 1 is a view showing a top surface of a light emitting device 200 according to a first embodiment of the present invention. FIG. 2 is a cross sectional view of the light emitting device 200, taken along line A-A' of FIG. 1.

Referring to FIGS. 1 and 2, the light emitting device 200 according to the first embodiment includes a conductive substrate 210, a first conductive layer 220, a via 221, a second conductive layer 230, electrode pads 231a and 231b, a first semiconductor layer 240, a second semiconductor layer 250, an active layer 260, an insulation layer 270 and a charge distribution layer 280.

Hereafter, for convenience of description, it is assumed that the first conductive layer 220 is an n-type conductive layer, the second conductive layer 230 is a p-type conductive layer, the first semiconductor layer 240 is an n-type semiconductor layer, and the second semiconductor layer 250 is a p-type semiconductor layer.

The conductive substrate 210 may be formed including at least one of Au, Ni, Al, Cu, W, Si, Se, Mo, Cu—W, SiGe, GaN and GaAs. For example, the conductive substrate 210 may be made of a metal alloy of Si and Al.

The n-type conductive layer 220 is formed on the conductive substrate 210. Here, the n-type conductive layer 220 may be an n-type conductive layer and may be formed including at least one of Al, Au, Pt, Ti, Cr, and W.

The n-type conductive layer 220 may include at least one via 221. The via 221 may be formed to penetrate the n-type conductive layer 220, the p-type conductive layer 230, the p-type semiconductor layer 250 and the active layer 260, and to project into a certain area of the n-type semiconductor layer 240.

The n-type semiconductor layer 240 may contact with the top surface of the via 221. Accordingly, the conductive substrate 210 and the n-type semiconductor layer 240 may be electrically connected with each other through the n-type conductive layer 220. Since the n-type conductive layer 220 is electrically connected to the conductive substrate 210 and the n-type semiconductor layer 240, it is desirable that the n-type conductive layer 220 should be formed of a material having minimal contact resistance with the conductive substrate 210 and the n-type semiconductor layer 240.

The insulation layer 270 may be formed on the n-type conductive layer 220 and the via 221 such that the n-type conductive layer 220 is electrically insulated from the layers other than the conductive substrate 210 and the n-type semiconductor layer 240. More specifically, the insulation layer 270 is formed between the n-type conductive layer 220 and the p-type conductive layer 230 and formed on the side wall of the via 221, so that the n-type conductive layer 220 can be electrically insulated from the p-type conductive layer 230, the p-type semiconductor layer 250 and the active layer 260. The insulation layer 270 may be also formed on the side wall of the area of the n-type conductive layer 220, which projects into the n-type semiconductor layer 240. The insulation layer 270 may be formed including at least one of silicon oxide ($SiO_2$), silicon nitride ($SiO_xN_y$, $Si_xN_y$), $Al_2O_3$ and fluoride based compound.

The p-type conductive layer 230 may be formed on the insulation layer 270. The p-type conductive layer 230 does not exist in the areas which the via 221 penetrates.

The p-type conductive layer 230 may include a reflective layer which reflects outwardly light generated from the p-type semiconductor layer 250, an ohmic contacting layer and the active layer 260 and improves light emission efficiency.

The p-type conductive layer 230 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, Pt, Ni, Au, Rh, Pd, Ag, Al, Ir.

The p-type conductive layer 230 may include at least one exposed area of the interface on which the p-type conductive layer 230 contacts with the p-type semiconductor layer 250. On the exposed area, the electrode pads 231a and 231b may be formed in order to connect an external power supply to the p-type conductive layer 230. On the exposed area, the p-type semiconductor layer 250, the active layer 260, the n-type semiconductor layer 240 and the charge distribution layer 280 are not formed. The electrode pads 231a and 231b may be, as shown in FIG. 1, formed in the corner of the light emitting device 200. This intends to maximize the light emitting area of the light emitting device 200.

Meanwhile, the active layer 260 exposed outward is able to function as a current leakage path during the working of the light emitting device 200. Here, such a problem can be prevented by forming a passivation layer (not shown) on the side wall of the light emitting device 200. The passivation layer (not shown) protects a light emitting structure, especially the active layer 260 from the outside and prevents a leakage current from flowing. The passivation layer (not shown) may be formed including at least any one of silicon oxide ($SiO_2$), silicon nitride ($SiO_xN_y$, $Si_xN_y$), metal oxide ($Al_2O_3$) and fluoride based compound.

The p-type semiconductor layer 250 may be formed on the p-type conductive layer 230. The active layer 260 may be formed on the p-type semiconductor layer 250. The n-type semiconductor layer 240 may be formed on the active layer 260.

The n-type semiconductor layer 240 may be formed of a semiconductor material having an empirical formula of $In_xAl_yGa_{(1-x-y)}N$ ($0 \leq x \leq 1$, $0 \leq y \leq 1$, $0 \leq x+y \leq 1$), for example, InAlGaN, GaN, AlGaN, InGaN, AlInN, AlN and InN and the like. An n-type dopant such as Si, Ge, Sn, Se and Te and the like may be doped in the n-type semiconductor layer 240.

The active layer 260 may be formed in one of a single quantum well structure, a multiple quantum well (MQW) structure, a quantum wire structure and a quantum dot structure. However, the structure of the active layer 260 is not limited to this.

By using group III-V compound semiconductor material, the active layer 260 may be formed in a single or multiple quantum well structure, a quantum wire structure or a quantum dot structure and the like.

When active layer 260 is formed in the quantum well structure, the active layer 260 may have, for example, a single or multiple quantum well structure which has a well layer having an empirical formula of $In_xAl_yGa_{(1-x-y)}N$ ($0 \leq x \leq 1$, $0 \leq y \leq 1$, $0 \leq x+y \leq 1$) and a barrier layer having an empirical formula of $In_aAl_bGa_{(1-a-b)}N$ ($0 \leq a \leq 1$, $0 \leq b \leq 1$, $0 \leq a+b \leq 1$).

The p-type semiconductor layer 250 may be formed of a semiconductor material having an empirical formula of $In_xAl_yGa_{(1-x-y)}N$ ($0 \leq x \leq 1$, $0 \leq y \leq 1$, $0 \leq x+y \leq 1$), for example, InAlGaN, GaN, AlGaN, InGaN, AlInN, AlN and InN and the like. A p-type dopant such as Mg, Zn, Ca, Sr and Ba and the like may be doped in the p-type semiconductor layer 250.

Meanwhile, a semiconductor layer having an opposite polarity to that of the p-type semiconductor layer 250 may be formed under the p-type semiconductor layer 250. That is, as first assumed above, when the second semiconductor layer 250 is the p-type semiconductor layer 250, an n-type semiconductor layer may be further disposed under the p-type semiconductor layer 250. As a result, a light emitting structural layer according to the embodiment may be formed including at least one of an N-P junction structure, a P-N junction structure, a P-N-P junction structure and an N-P-N junction structure.

The charge distribution layer 280 is formed within the n-type semiconductor layer 240 and may be formed above the via 221 in the internal area of the n-type semiconductor layer 240. The charge distribution layer 280 may be placed at one position or several positions within the n-type semiconductor layer 240. It does not matter that the charge distribution layer 280 is ununiformly formed.

The charge distribution layer 280 may have a carrier concentration lower than that of the n-type semiconductor layer 240. The concentration of an n-type carrier doped in the charge distribution layer may be lower than that of an n-type carrier of the first semiconductor layer. Or, an n-type carrier together with a p-type carrier may be doped in the charge distribution layer. For example, the charge distribution layer 280 may have a doping concentration equal to or less than ⅔ that of a neighboring n-type semiconductor layer 240 through silicon-doping. Otherwise, the charge distribution layer 280 may not be doped with a conductive dopant and may have electrical conductivity lower than that of the n-type semiconductor layer 240.

Depending on a doping concentration difference, the electrical conductivity of the n-type semiconductor layer 240 is relatively higher than that of the charge distribution layer 280. Accordingly, the charge distribution layer 280 uniformly scatters electrons to the n-type semiconductor layer 240 having relatively higher electrical conductivity (under the charge distribution layer 280), so that electric current concentrating only around the via 221 can be scattered from left to right and right to left.

As such, when the charge distribution layer 280 is formed close to the via 221 in the internal area of the n-type semiconductor layer 240, electric current injected through the via 221 can be uniformly scattered from left to right and right to left, electric current concentrating only around the via 221 can be alleviated.

Meanwhile, since the active layer 260 exposed outward functions as a current leakage path during the running of the light emitting device 200, such a problem can be solved by forming a passivation layer 290 on the side walls of the second conductive layer 230, the second semiconductor layer 250, the active layer 260 and the first semiconductor layer 240. The passivation layer 290 may be formed from the side wall of the second conductive layer 230 to the side wall of the first semiconductor layer 240 lower than the charge distribution layer 280. The passivation layer 290 protects the active layer 260 from the outside and restrains leakage current from flowing. The passivation layer 290 may be formed including at least one of silicon oxide ($SiO_2$), silicon nitride ($SiO_xN_y$, $Si_xN_y$), metal oxide ($Al_2O_3$) and fluoride based compound.

Second Embodiment and Modified Embodiment

Figure 3A:
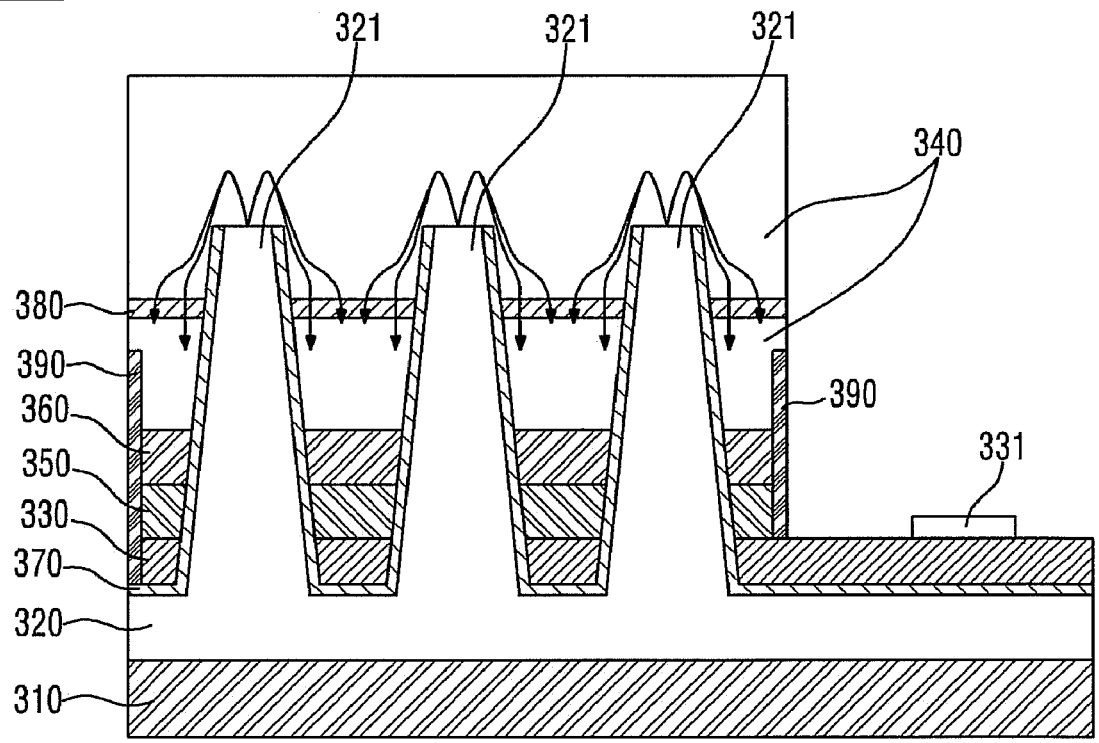
FIG. 3a is a cross sectional view of a light emitting device according to a second embodiment of the present invention.
Figure 3B:
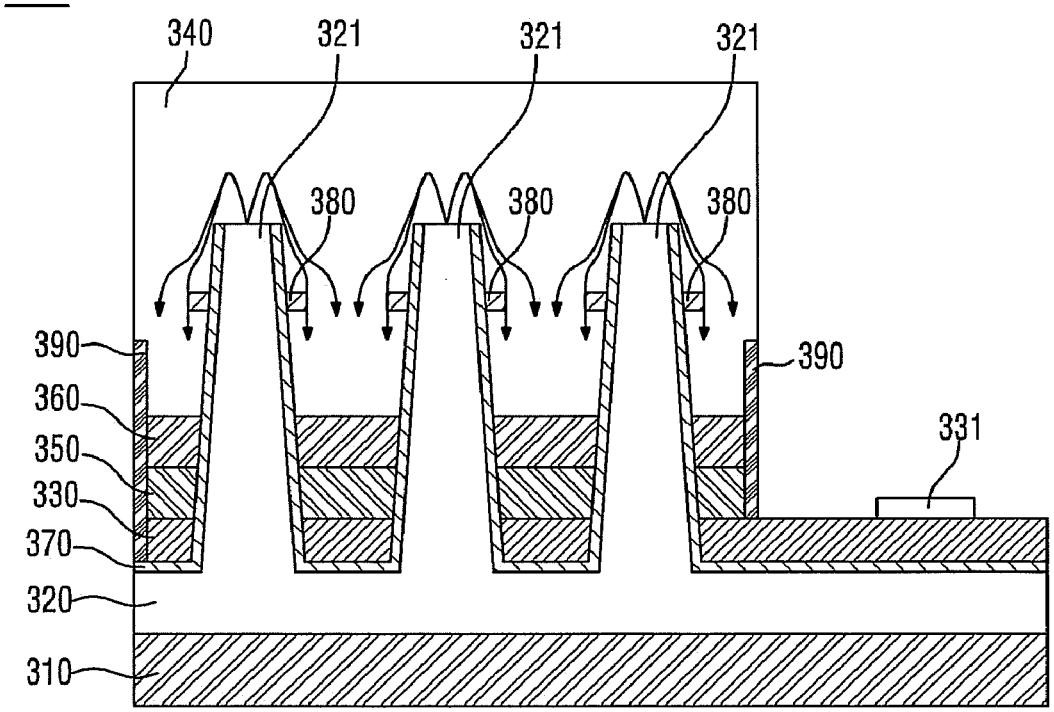
FIG. 3b is a cross sectional view of a light emitting device according to a modified embodiment of the present invention.

FIG. 3a is a cross sectional view of a light emitting device 300a according to a second embodiment of the present invention. FIG. 3b is a cross sectional view of a light emitting device 300b according to a modified embodiment of the present invention.

First, referring to FIGS. 3a and 3b, the light emitting devices 300a and 300b according to the second embodiment include a conductive substrate 310, an n-type conductive layer 320, a via 321, a p-type conductive layer 330, an electrode pad 331, an n-type semiconductor layer 340, a p-type semiconductor layer 350, an active layer 360, an insulation layer 370 and a charge distribution layer 380.

The conductive substrate 310 may be formed including at least one of Au, Ni, Al, Cu, W, Si, Se, Mo, Cu—W, SiGe, GaN and GaAs. For example, the conductive substrate 310 may be made of a metal alloy of Si and Al.

The n-type conductive layer 320 is formed on the conductive substrate 310. Here, the n-type conductive layer 320 may be an n-type conductive layer and may be formed including at least one of Al, Au, Pt, Ti, Cr, and W.

The n-type conductive layer 320 may include at least one via 321. The via 321 may be formed to penetrate the n-type conductive layer 320, the p-type conductive layer 330, the p-type semiconductor layer 350 and the active layer 360, and to project into a certain area of the n-type semiconductor layer 340.

The n-type semiconductor layer 340 may contact with the top surface of the via 321. Accordingly, the conductive substrate 310 and the n-type semiconductor layer 340 may be electrically connected with each other through the n-type conductive layer 320. Since the n-type conductive layer 320 is electrically connected to the conductive substrate 310 and the n-type semiconductor layer 340, it is desirable that the n-type conductive layer 320 should be formed of a material having minimal contact resistance with the conductive substrate 310 and the n-type semiconductor layer 340.

The insulation layer 370 may be formed on the n-type conductive layer 320 and the via 321 such that the n-type conductive layer 320 is electrically insulated from the layers other than the conductive substrate 310 and the n-type semiconductor layer 340. More specifically, the insulation layer 370 is formed between the n-type conductive layer 320 and the p-type conductive layer 330 and formed on the side wall of the via 321, so that the n-type conductive layer 320 can be electrically insulated from the p-type conductive layer 330, the p-type semiconductor layer 350 and the active layer 360. The insulation layer 370 may be also formed on the side wall of the area of the n-type conductive layer 320, which projects into the n-type semiconductor layer 340. The insulation layer 370 may be formed including at least one of silicon oxide ($SiO_2$), silicon nitride ($SiO_xN_y$, $Si_xN_y$), $Al_2O_3$ and fluoride based compound.

The p-type conductive layer 330 may be formed on the insulation layer 370. The p-type conductive layer 330 does not exist in the areas which the via 321 penetrates. The p-type conductive layer 330 may be a p-type conductive layer.

The p-type conductive layer 330 may include a reflective layer which reflects outwardly light generated from the p-type semiconductor layer 350, an ohmic contacting layer and the active layer 360 and improves light emission efficiency.

The p-type conductive layer 330 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, Pt, Ni, Au, Rh, Pd, Ag, Al, Ir.

The p-type conductive layer 330 may include at least one exposed area of the interface on which the p-type conductive layer 330 contacts with the p-type semiconductor layer 350. On the exposed area, the electrode pad 331 may be formed in order to connect an external power supply to the p-type conductive layer 330. On the exposed area, the p-type semiconductor layer 350, the active layer 360, the n-type semiconductor layer 340 and the charge distribution layer 380 are not formed. Like the electrode pads 231a and 231b of the first embodiment, the electrode pad 331 may be formed in the corners of the light emitting devices 300a and 300b. This intends to maximize the light emitting areas of the light emitting devices 300a and 300b.

Meanwhile, the active layer 360 exposed outward is able to function as a current leakage path during the working of the light emitting devices 300a and 300b. Here, such a problem can be prevented by forming a passivation layer (not shown) on the side wall of the light emitting devices 300a and 300b. The passivation layer (not shown) protects a light emitting structure, especially the active layer 360 from the outside and prevents a leakage current from flowing. The passivation layer (not shown) may be formed including at least any one of silicon oxide ($SiO_2$), silicon nitride ($SiO_xN_y$, $Si_xN_y$), metal oxide ($Al_2O_3$) and fluoride based compound.

The p-type semiconductor layer 350 may be formed on the p-type conductive layer 330. The active layer 360 may be formed on the p-type semiconductor layer 350. The n-type semiconductor layer 340 may be formed on the active layer 360.

The n-type semiconductor layer 340 may be formed of a semiconductor material having an empirical formula of $In_xAl_yGa_{(1-x-y)}N$ ($0 \leq x \leq 1$, $0 \leq y \leq 1$, $0 \leq x+y \leq 1$), for example, InAlGaN, GaN, AlGaN, InGaN, AlInN, AlN and InN and the like. An n-type dopant such as Si, Ge, Sn, Se and Te and the like may be doped in the n-type semiconductor layer 340.

The active layer 360 may be formed in one of a single quantum well structure, a multiple quantum well (MQW) structure, a quantum wire structure and a quantum dot structure. However, the structure of the active layer 360 is not limited to this.

By using group III-V compound semiconductor material, the active layer 360 may be formed in a single or multiple quantum well structure, a quantum wire structure or a quantum dot structure and the like.

When active layer 360 is formed in the quantum well structure, the active layer 260 may have, for example, a single or multiple quantum well structure which has a well layer having an empirical formula of $In_xAl_yGa_{(1-x-y)}N$ ($0 \leq x \leq 1$, $0 \leq y \leq 1$, $0 \leq x+y \leq 1$) and a barrier layer having an empirical formula of $In_aAl_bGa_{(1-a-b)}N$ ($0 \leq a \leq 1$, $0 \leq b \leq 1$, $0 \leq a+b \leq 1$).

The p-type semiconductor layer 350 may be formed of a semiconductor material having an empirical formula of $In_xAl_yGa_{(1-x-y)}N$ ($0 \leq x \leq 1$, $0 \leq y \leq 1$, $0 \leq x+y \leq 1$), for example, InAlGaN, GaN, AlGaN, InGaN, AlInN, AlN and InN and the like. A p-type dopant such as Mg and Zn and the like may be doped in the p-type semiconductor layer 350.

Meanwhile, a semiconductor layer having an opposite polarity to that of the p-type semiconductor layer 350 may be formed under the p-type semiconductor layer 350. That is, as first assumed above, when the second semiconductor layer 350 is the p-type semiconductor layer 350, an n-type semiconductor layer may be further disposed under the p-type semiconductor layer 350. As a result, a light emitting structural layer according to the embodiment may be formed including at least one of an N-P junction structure, a P-N junction structure, a P-N-P junction structure and an N-P-N junction structure.

The charge distribution layer 380 may be penetrated by the area of the via 321, which projects into the n-type semiconductor layer 340. For example, as shown in FIG. 3a, the charge distribution layer 380 may be formed in the form of one layer which is penetrated by the areas of a plurality of the projecting vias 321. Or, as shown in FIG. 3b, the charge distribution layer 380 may be formed in the form of a plurality of layers which are penetrated by the plurality of the projecting vias 321 respectively. That is, the charge distribution layer 380 may be formed in the form of a plurality of separated layers. The plurality of the charge distribution layers 380 may be formed to be penetrated respectively by the plurality of the vias 321. Here, one charge distribution layer 380 may be formed to be penetrated by at least one via 321 or by two or more vias 321. Here, as described above, the charge distribution layer 380 does not exist in the area which the via 321 penetrates.

It is recommended that the charge distribution layer 380 should have a carrier concentration lower than that of the n-type semiconductor layer 340. For example, the charge distribution layer 380 may have a doping concentration equal to or less than ⅔ that of a neighboring n-type semiconductor layer 340 through silicon-doping. Otherwise, the charge distribution layer 380 may not be doped with a conductive dopant and may have electrical conductivity lower than that of the n-type semiconductor layer 340.

Depending on a doping concentration difference, the electrical conductivity of the n-type semiconductor layer 340 is relatively higher than that of the charge distribution layer 380. Accordingly, the charge distribution layer 380 uniformly scatters electrons to the n-type semiconductor layer 340 having relatively higher electrical conductivity (under the charge distribution layer 380), so that electric current concentrating only around the via 321 can be scattered from left to right and right to left.

As such, when the charge distribution layer 380 is formed close to the via 321, electric current injected through the via 321 can be uniformly scattered from left to right and right to left, electric current concentrating only around the via 321 can be alleviated.

Meanwhile, since the active layer 360 exposed outward functions as a current leakage path during the running of the light emitting devices 300a and 300b, such a problem can be solved by forming a passivation layer 390 on the side walls of the second conductive layer 330, the second semiconductor layer 350, the active layer 360 and the first semiconductor layer 340. The passivation layer 390 may be formed from the side wall of the second conductive layer 330 to the side wall of the first semiconductor layer 340 lower than the charge distribution layer 380. The passivation layer 390 protects the active layer 360 from the outside and restrains leakage current from flowing. The passivation layer 390 may be foamed including at least one of silicon oxide ($SiO_2$), silicon nitride ($SiO_xN_y$, $Si_xN_y$), metal oxide ($Al_2O_3$) and fluoride based compound.

[Light Emitting Device Package]

Figure 4:
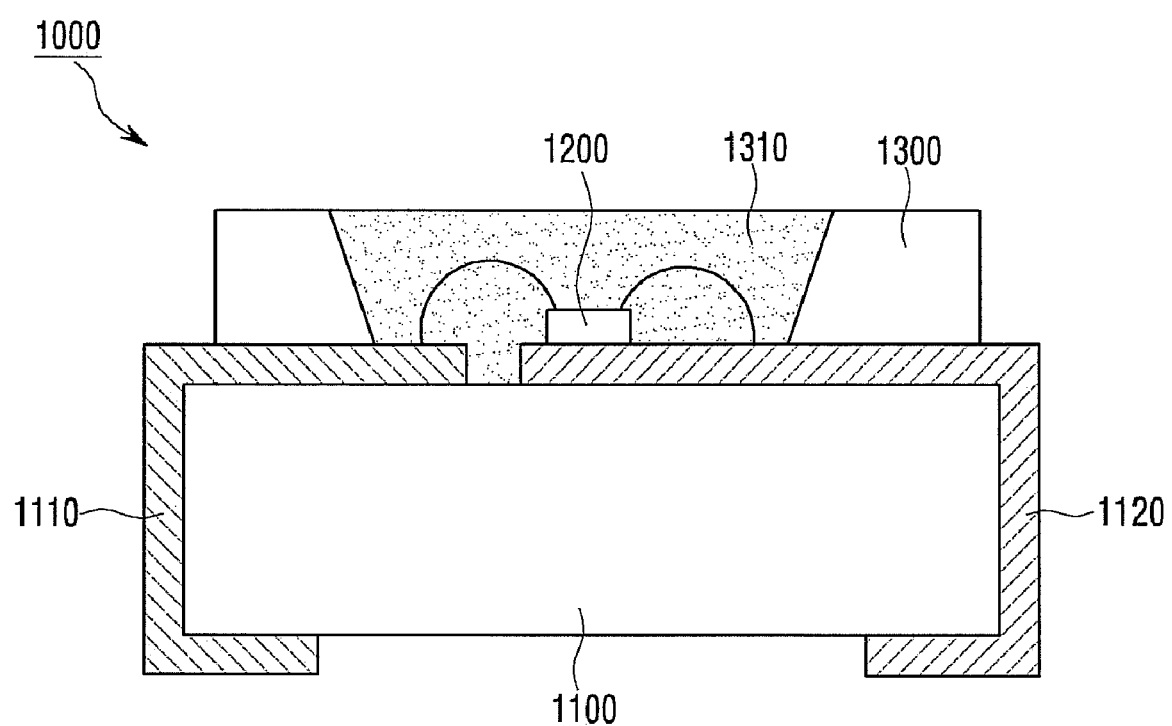
FIG. 4 is a cross sectional view showing schematically a light emitting device package.

Hereafter, a light emitting device package according to an embodiment will be described with reference to FIG. 4. FIG. 4 is a cross sectional view showing schematically a light emitting device package 1000.

As shown in FIG. 4, the light emitting device package 1000 according to the embodiment includes a package body 1100, a first electrode layer 1110, a second electrode 1120, a light emitting device 1200 and a filler 1300.

The package body 1100 is formed including a silicon material, a synthetic resin material or a metallic material. Inclined surfaces are formed around the light emitting device 1200, thereby improving the light-extraction efficiency.

The first electrode layer 1110 and the second electrode 1120 are disposed in the package body 1100. The first electrode layer 1110 and the second electrode 1120 are electrically isolated from each other and supply electric power to the light emitting device 1200. The first electrode layer 1110 and the second electrode 1120 reflect light generated from the light emitting device 1200 and increase luminous efficiency. The first electrode layer 1110 and the second electrode 1120 also exhaust heat generated from the light emitting device 1200.

The light emitting device 1200 is electrically connected to the first electrode layer 1110 and the second electrode 1120. The light emitting device 1200 is disposed on the package body 1100 or is disposed on either the first electrode layer 1110 or the second electrode 1120.

The light emitting device 1200 is also electrically connected to the first electrode layer 1110 and the second electrode 1120 in a wire bonding manner or in a flip-chip manner and in a die-bonding process.

The filler 1300 is formed to surround and protect the light emitting device 1200. The filler 1300 includes a fluorescent material and changes the wavelength of light emitted from the light emitting device 1200.

The light emitting device package 1000 is equipped with at least one or a plurality of the light emitting devices disclosed in the embodiments. There is no limited to the number of the light emitting devices.

A plurality of the light emitting device packages 1000 according to the embodiment are arrayed on the support member. An optical member such as a light guide plate, a prism sheet and a diffusion sheet and the like may be disposed on the optical path of the light emitting device package 1000. Such a light emitting device package 1000, the support member and the optical member are able to function as a light unit.

Another embodiment can be implemented by a display device, a BLU and a lighting device and the like, all of which include the semiconductor light emitting device or the light emitting device package which has been described in the aforementioned embodiments. For example, the lighting device may include a lamp and a street lamp.

[Lighting Device]

Figure 5:
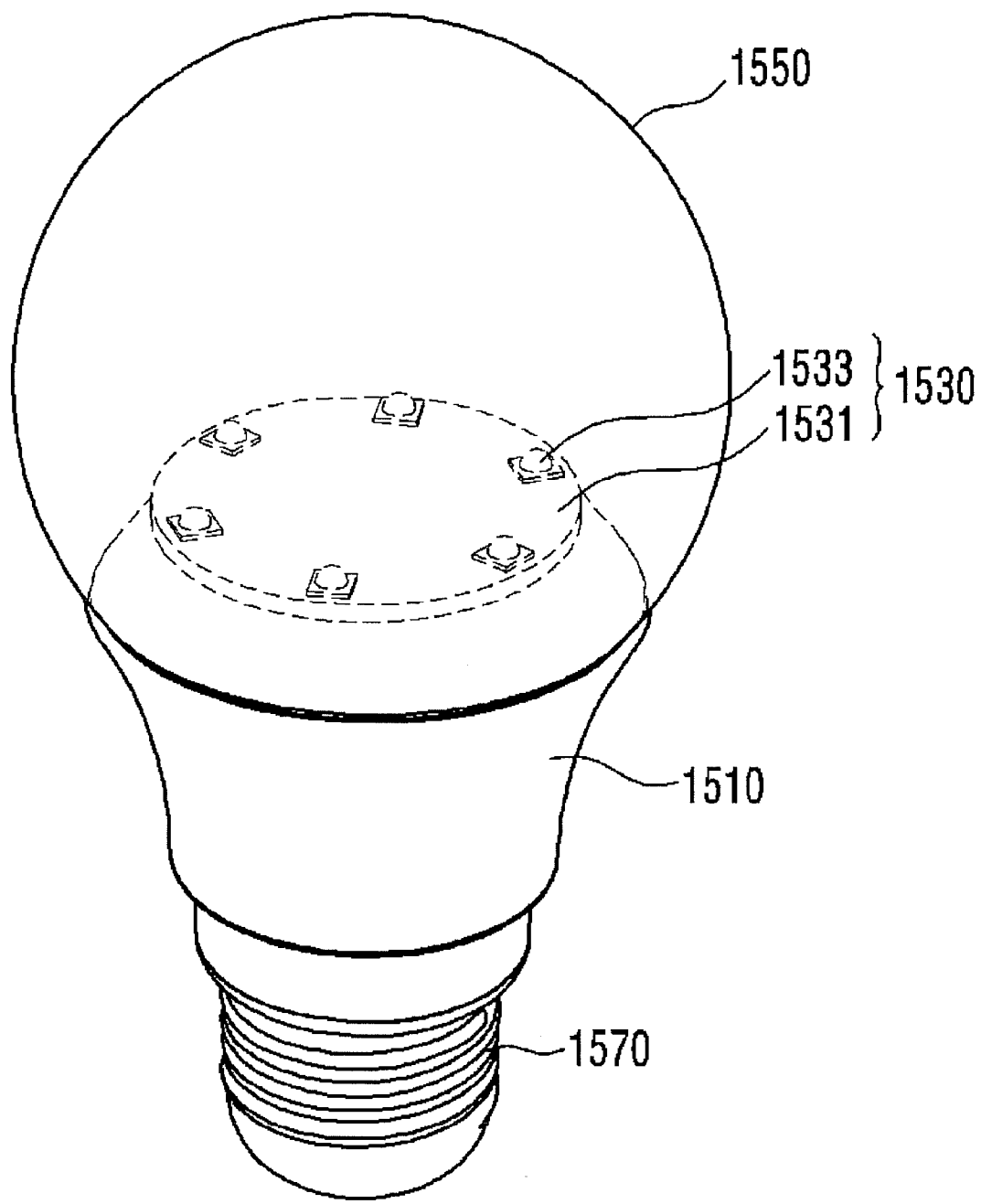
FIG. 5 is a perspective view showing a lighting device including the light emitting device package shown in FIG. 4.

FIG. 5 is a perspective view showing a lighting device 1500 including the light emitting device package shown in FIG. 4.

Referring to FIG. 5, the lighting device 1500 may include a case 1510, a light emitting module 1530 disposed on the case 1510, a cover 1550 connected to the case 1510, and a connection terminal 1570 connected to the case 1510 and supplied with an electric power from an external power supply.

The case 1510 may be formed of a material having an excellent heat radiating characteristic, for example, a metal material or a resin material.

The light emitting module 1530 may include a board 1531 and at least one light emitting device package 1533 which is based on the embodiment and is mounted on the board 1531. The plurality of the light emitting device packages 1533 may be radially arranged apart from each other at a predetermined interval on the board 1531.

The board 1531 may be an insulating substrate on which a circuit pattern has been printed, and may include, for example, a printed circuit board (PCB), a metal core PCB, a flexible PCB, a ceramic PCB, an FR-4 substrate, etc.

Also, the board 1531 may be formed of a material capable of efficiently reflecting light. The surface of the board 1531 may have a color capable of efficiently reflecting light, such as white or silver.

The at least one light emitting device package 1533 may be disposed on the board 1531. Each of the light emitting device packages 1533 may include at least one light emitting diode (LED) chip. The LED chip may include both a LED emitting red, green, blue or white light and a UV LED emitting ultraviolet (UV).

The light emitting module 1530 may have various combinations of the light emitting device packages so as to obtain desired color and luminance. For example, the light emitting module 1530 may have a combination of a white LED, a red LED and a green LED in order to obtain a high color rendering index (CRI).

The connection terminal 1570 may be electrically connected to the light emitting module 1530 in order to supply power. The connection terminal 1570 may be screwed and connected to an external power in the form of a socket. However, there is no limit to the method for connecting the connection terminal 1570 to an external power. For example, the connection terminal 1570 may be made in the form of a pin and inserted into the external power, or may be connected to the external power through a power line.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive substrate;
a first conductive layer formed on the conductive substrate;
a second conductive layer formed on the first conductive layer;
a second semiconductor layer formed on the second conductive layer;
an active layer formed on the second semiconductor layer;
a first semiconductor layer formed on the active layer; and
an insulation layer,
wherein the first conductive layer includes at least one via which penetrates the second conductive layer, the second semiconductor layer and the active layer and projects into a certain area of the first semiconductor layer, and then is electrically connected to the first semiconductor layer,
wherein the insulation layer is formed between the first conductive layer and the second conductive layer and on the side wall of the via,
wherein the first semiconductor layer includes a charge distribution layer therein, and
wherein the charge distribution layer has a charge concentration lower than that of the first semiconductor layer.

2. The light emitting device of claim 1, wherein the charge distribution layer is formed above the via.

3. The light emitting device of claim 1, wherein the charge distribution layer is penetrated by an area of the via, which projects into the first semiconductor layer.

4. The light emitting device of claim 1, wherein the charge distribution layer is formed in the form of a plurality of layers.

5. The light emitting device of claim 1, wherein the second conductive layer comprises at least one exposed area of surface forming an interface with the second semiconductor layer, and further comprises an electrode pad formed on the exposed area of the second conductive layer.

6. The light emitting device of claim 5, wherein the electrode pad is formed in the corner of the light emitting device.

7. The light emitting device of claim 1, wherein the conductive layer comprises at least one of Au, Ni, Al, Cu, W, Si, Se, Mo, Cu—W, SiGe, GaN and GaAs.

8. The light emitting device of claim 1, wherein the first conductive layer comprises at least one of Al, Au, Pt, Ti, Cr, and W.

9. The light emitting device of claim 1, wherein the second conductive layer comprises at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, Pt, Ni, Au, Rh, Pd, Ag, Al, Ir.

10. The light emitting device of claim 1, wherein the second conductive layer reflects light generated from the active layer.

11. The light emitting device of claim 1, wherein the charge distribution layer is doped to have a doping concentration less than ⅔ that of the first semiconductor layer.

12. The light emitting device of claim 1, further comprising a passivation layer disposed on the side walls of the second conductive layer, the second semiconductor layer, the active layer and the first semiconductor layer, in order to restrain leakage current of the active layer.

13. The light emitting device of claim 1, wherein the first semiconductor layer is doped with an n-type carrier.

14. The light emitting device of claim 13, wherein the charge distribution layer is doped with the n-type carrier, and has a carrier concentration lower than that of the first semiconductor layer.

15. The light emitting device of claim 13, wherein the charge distribution layer is doped with an n-type carrier together with a p-type carrier.

16. A light emitting device package comprising:
a package body;
a first and a second electrode layers disposed on the package body; and
a light emitting device electrically connected to the first and the second electrode layers,
wherein the light emitting device corresponds to a light emitting device according to claim 1.

17. A lighting device comprising:
a case;
a light emitting module disposed within the case; and
a connection terminal disposed within the case and electrically connected to the light emitting module in such a manner as to be supplied with an electric power from an external power supply,
wherein the light emitting module includes an light emitting device package according to claim 16.

18. A light emitting device comprising:
a conductive substrate;
a first conductive layer formed on the conductive substrate;
a second conductive layer formed on the first conductive layer;
a second semiconductor layer formed on the second conductive layer;
an active layer formed on the second semiconductor layer;
a first semiconductor layer formed on the active layer; and
an insulation layer,
wherein the first conductive layer includes at least one via which penetrates the second conductive layer, the second semiconductor layer and the active layer and projects into a certain area of the first semiconductor layer, and then is electrically connected to the first semiconductor layer,
wherein the insulation layer is formed between the first conductive layer and the second conductive layer and on the side wall of the via,
wherein the first semiconductor layer includes a charge distribution layer therein, and
wherein the charge distribution layer has an electrical conductivity lower than that of the first semiconductor layer.

* * * * *